United States Patent [19]

Sidiski

[11] Patent Number: 5,337,250
[45] Date of Patent: Aug. 9, 1994

[54] APPARATUS FOR TESTING A MICROPROCESSOR BASED REGISTER

[76] Inventor: Joseph F. Sidiski, 43 Parkway Dr., Syosset, N.Y. 11791

[21] Appl. No.: 856,538

[22] Filed: Mar. 24, 1992

[51] Int. Cl.$^5$ .................................................. G01R 17/00
[52] U.S. Cl. ................................. 364/481; 364/551.01
[58] Field of Search .......... 364/480, 481, 483, 464.04, 364/551.01, 492; 324/510, 511; 361/365, 369

[56] References Cited

U.S. PATENT DOCUMENTS

| | | | |
|---|---|---|---|
| 3,714,516 | 1/1973 | Howe .................... | 317/104 |
| 4,242,730 | 12/1980 | Golias et al. . | |
| 4,434,403 | 2/1984 | Chang .................... | 328/120 |
| 4,788,462 | 11/1988 | Vesce et al. ............ | 307/597 |
| 4,799,140 | 1/1989 | Dietz et al. ............. | 364/140 |

*Primary Examiner*—Thomas G. Black
*Assistant Examiner*—Michael Zanelli
*Attorney, Agent, or Firm*—Brooks Haidt Haffner & Delahunty

[57] ABSTRACT

A plurality of test stations containing a zero force insertion socket are provided for accommodating an equal plurality of electric energy meters containing a microprocessor-based demand register. Switchable circuitry is provided for applying power to each socket to configure the socket for a particular model meter and register. The locking lever of the socket provides manual input for interruption of power to the socket. Detectors monitor the presence and absence of a meter in a socket. A system microprocessor provides signals for testing the register which are applied via a removable cable from a front panel connector to the connector of the register normally used to connect the register with the meter disk rotation optical detector. A special circuit is provided for automatically resetting all digital circuits upon initiating application of power to the system.

15 Claims, 9 Drawing Sheets

APPARATUS FOR TESTING A MICROPROCESSOR BASED REGISTER

BACKGROUND OF THE INVENTION

The present invention relates to apparatus for testing the microprocessor-based register in electric energy meters. In particular, it relates to the testing of the registers now being used in electric energy demand meters.

Energy metering has undergone a significant change in the last several years. The mechanically complex energy/demand meter has given way to a hybrid meter consisting of an electromechanical energy measuring disk assembly combined with an electronic register which can monitor demand as well as time of use of the energy. Testing of this hybrid assembly has presented a challenge to the utility industry. The electromechanical disk assembly could be tested by measuring the energy needed for each rotation of the disk (a standard technique), but such technique is not adequate for testing the electronic register. The existing procedure involves long term operation of a complete meter assembly. Results from such tests, where the demand register is electronic, often mask register malfunction due to the inherent inaccuracy of the basic metering device on which the register is being tested.

SUMMARY OF THE PRESENT INVENTION

It is therefore an object of the present invention to eliminate the influence of the metering device from the test performed on the register unit, the register unit being a discrete microprocessor-based assembly packaged as a part of the energy meter.

More specifically, an object of the invention is to test both demand registers and time-of-use registers without including any metering errors caused by the electromechanical assembly. The electromechanical assembly consists of the usual eddy current disk rotating in the field of strong permanent magnets under the influence of fields developed by voltage and current coils. Rotation of the disk is communicated to a mechanical dial indicator whose reading represents total energy consumed. For indicating demand, a register is provided that includes a clock timing device and means to indicate the highest level of total energy consumption during each of successive time intervals of predetermined duration.

In accordance with one aspect of the present invention there is provided apparatus for testing a microprocessor-based register in an electric energy meter comprising in combination a power supply circuit, means controlled by a switch for selectively coupling said power supply circuit to a source of electric energy, a testing microprocessor, a pulse generator coupled to said testing microprocessor, a plural contact meter socket, means coupled to said testing microprocessor and to said socket for detecting the presence or absence of a meter inserted in said socket, means for coupling an input/output port of said register to said testing microprocessor, means coupled with said testing microprocessor and to said power supply circuit for supplying electric energy to said meter socket when a meter is present for energizing said register in said meter, and means for controlling said testing microprocessor for causing pulses to be fed from said pulse generator to said register in a predetermined manner for testing the operation of said register.

In accordance with another aspect of the present invention there is provided apparatus for resetting a microprocessor system wherein said microprocessor includes a plurality of resettable components and a reset and interrupt control circuit, said latter circuit comprising reset signal generating means and means for generating a master reset signal commencing with the connection of a power supply circuit to a source of electric energy and terminating a controlled interval thereafter.

BRIEF DESCRIPTION OF THE DRAWINGS

The invention will be better understood after reading the following detailed description of the presently preferred embodiment thereof with reference to the appended drawings in which.

The same reference numerals are used throughout the drawings to designate the same or similar parts.

DETAILED DESCRIPTION OF THE PRESENTLY PREFERRED EMBODIMENT

Figure 1:
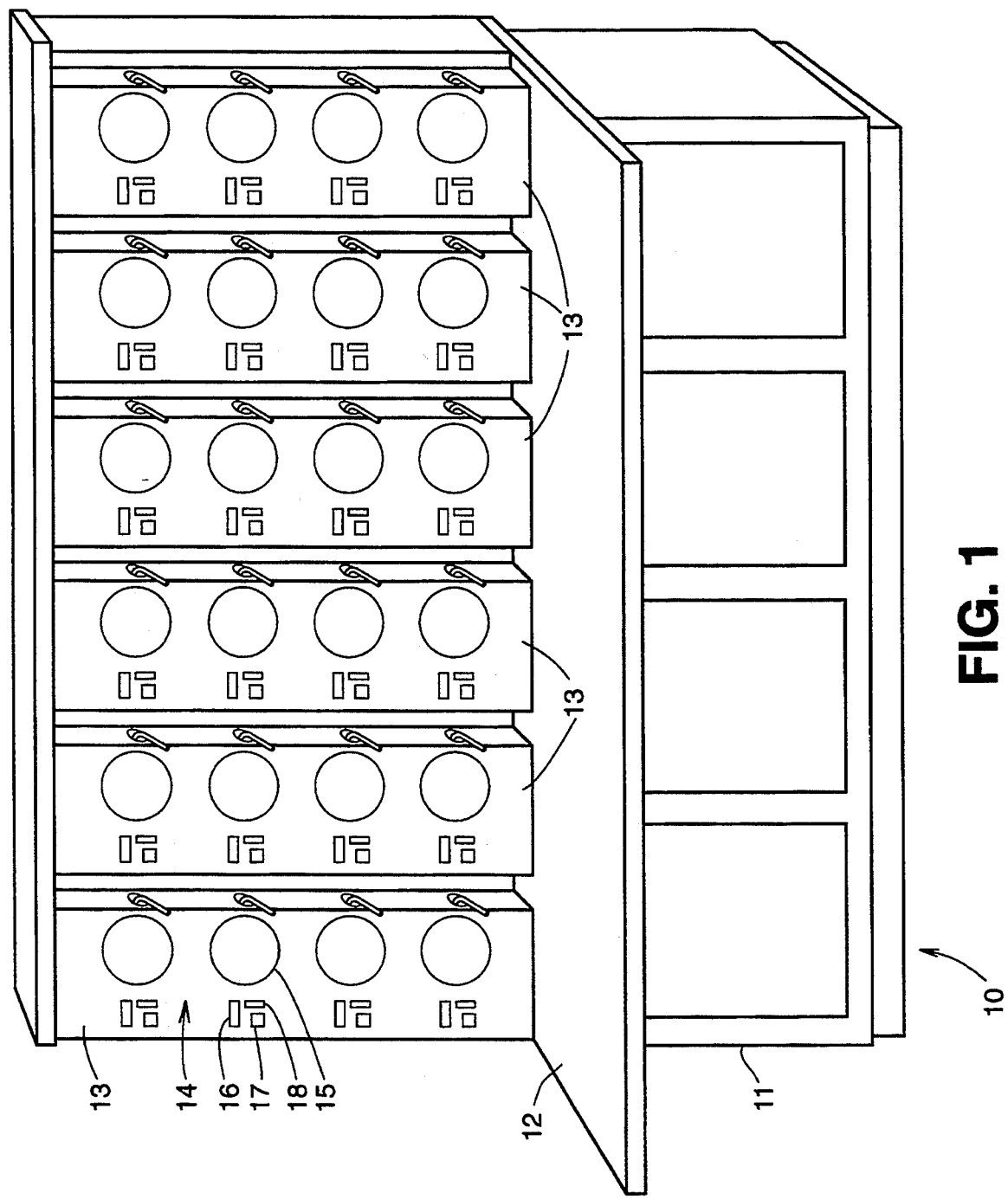
FIG. 1 is a perspective illustration of the test bench assembly embodying the present invention and showing somewhat diagrammatically the individual test stations for mounting a meter to be tested.

Referring to FIG. 1, there is shown a test bench or console designated generally by the numeral 10. The bench 10 consists of a base 11 supporting a table top 12 towards the back of which is mounted a plurality, here six, of vertical columns 13. A plurality of identical stations, one of which is identified by the reference numeral 14, are located in the columns 13 for mounting and serving a meter containing a register to be tested. As illustrated, there are four stations 14 in each column for a total of twenty four in the bench 10. As will appear from the description to follow, the number of columns and stations to a column can be varied if desired. Each station consists of a socket 15 for receiving and mounting a meter, an LCD two line, sixteen character display 16, a push button 17, and a fourteen pin connector 18. The details of the various components constituting a station 14 will be described later.

Figure 2:
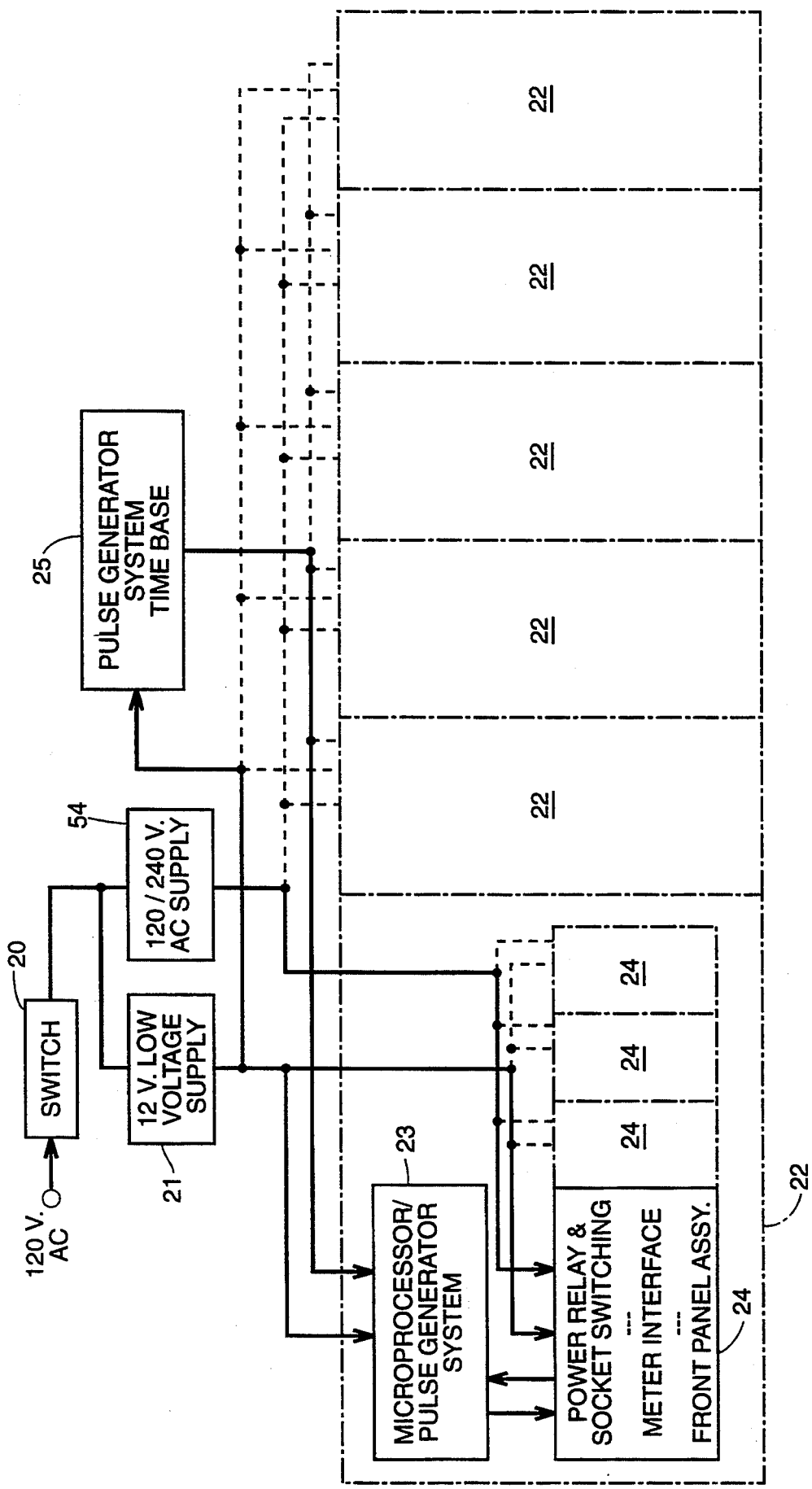
FIG. 2 is a generalized system block diagram showing the overall organization of the testing apparatus.

Referring to FIG. 2, there is shown in block diagram and outline form the major breakdown of the electrical and electronic system housed in the bench 10 for powering and testing the meter registers. A switch 20 serves to interconnect a source of 120 V. AC electric energy with a 12 V. low voltage supply 21 and a 120/240 V. AC supply 54. The voltage supplies 21 and 54 feed a series of six identical units each designated generally by the numeral 22. The units 22 each serve a different one of the columns 13 and the four stations 14 located in the column.

Each of the units 22 consists of a microprocessor/pulse generator system 23, and four identical units 24, the system 23 receiving power from the voltage supply 21, and all of the units 24 receiving power from both the low voltage supply 21 and the supply 54. Each unit 24 consists of a power relay and socket switching circuit, a meter interface, and a front panel assembly (a station 14). Finally, a pulse generator system time base 25 is powered by the low voltage supply 21 and feeds signals in common to all of the units 23 in the units 22.

Figure 3:
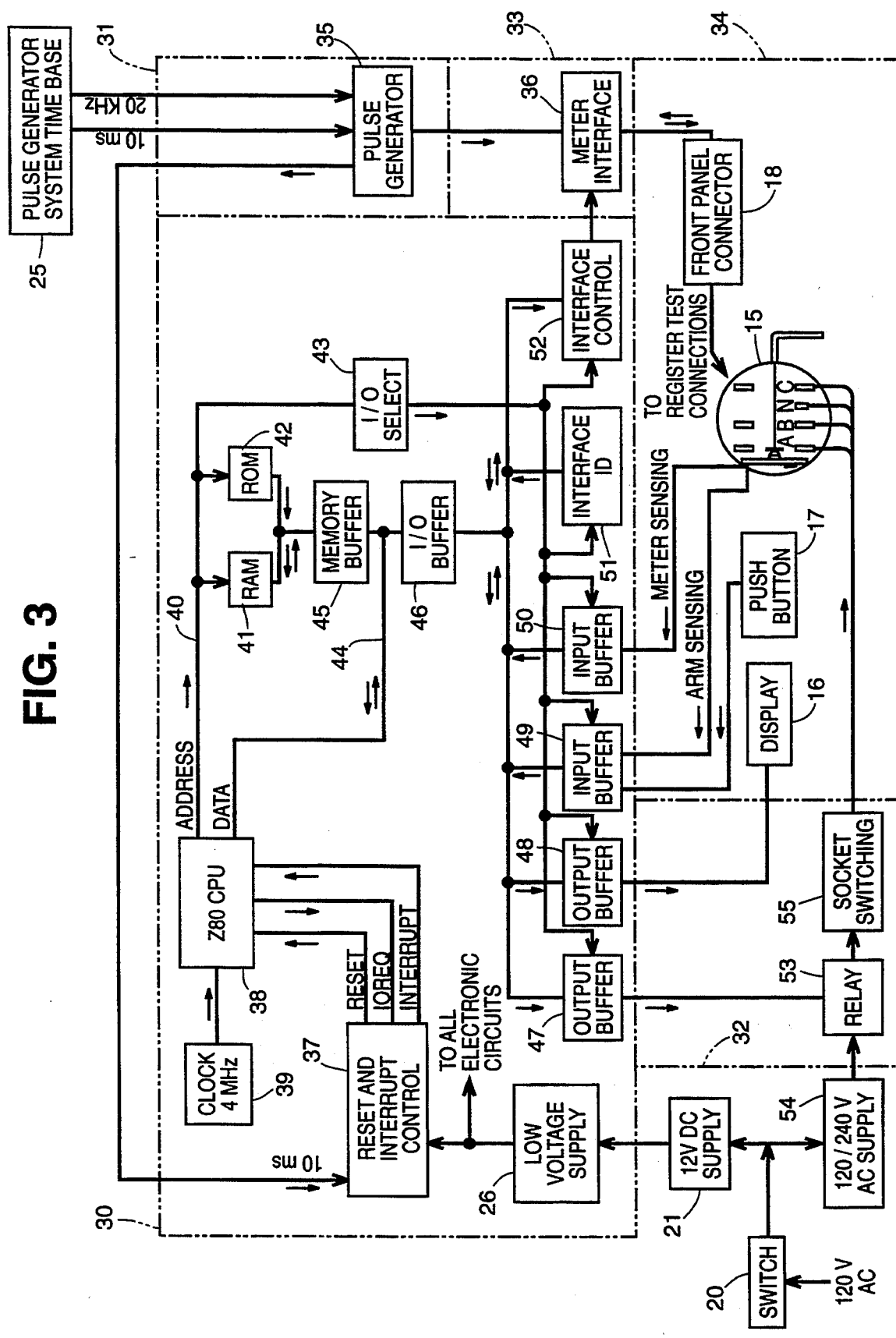
FIG. 3 is a block diagram detailing the components shown in solid lines in FIG. 2.

Now reference should be had to FIG. 3 for a more detailed explanation of the units described with reference to FIG. 2. The microprocessor/pulse generator system includes the components shown within the phantom outlined boxes 30 and 31, while the unit 24 encompasses the components within the phantom outlined boxes 32, 33, and 34.

The unit 31 includes a pulse generator 35 which is supplied with 10 ms and 20 KHz signals from the time base 25 and feeds pulses to a meter interface 36 in unit 33, and to a reset and interrupt control 37 in unit 30. The reset and interrupt control 37 receives low voltage power from a low voltage supply 26 and supplies RESET and INTERRUPT signals to a Zilog Z80 microprocessor (central processing unit) 38. The microprocessor 38 receives clocking signals from a 4 MHz clock 39, furnishes an input/output request signal to the reset and interrupt control 37, furnishes address signals over an address bus 40 to a RAM 41, a ROM 42, and an I/O SELECT system 43, and transmits and receives data signals over a DATA bus 44. As shown, the bus 44 connects with a memory buffer 45 and an I/O buffer 46. Also, as shown, the RAM 41 communicates bidirectionally with the memory buffer 45, while the ROM 42 feeds the memory buffer 45.

The I/O buffer 46 communicates, as shown by the various arrows, with output buffers 47 and 48, input buffers 49 and 50, an interface ID (identification) circuit 51, and an interface control circuit 52. The interface control circuit 52 controls the meter interface 36. The output buffer 47 controls a relay 53 located within the box 32 which relay is supplied with energy from the 120/240 volt AC supply 54. The relay 53, when actuated by a signal from the output buffer 47, applies power to a socket switching circuit 55. As seen in FIG. 3, the display 16 receives control from the output buffer 48, while the push button 17 provides signals to the input buffer 49. The output from the socket switching circuit 55 is applied to terminals in the socket 15, the details of which will be described below. At this point in the description, it should be sufficient to note that sensors (to be described), associated with the socket 15, provide arm sensing and meter sensing signals, respectively, to the input buffers 49 and 50.

Figure 5:
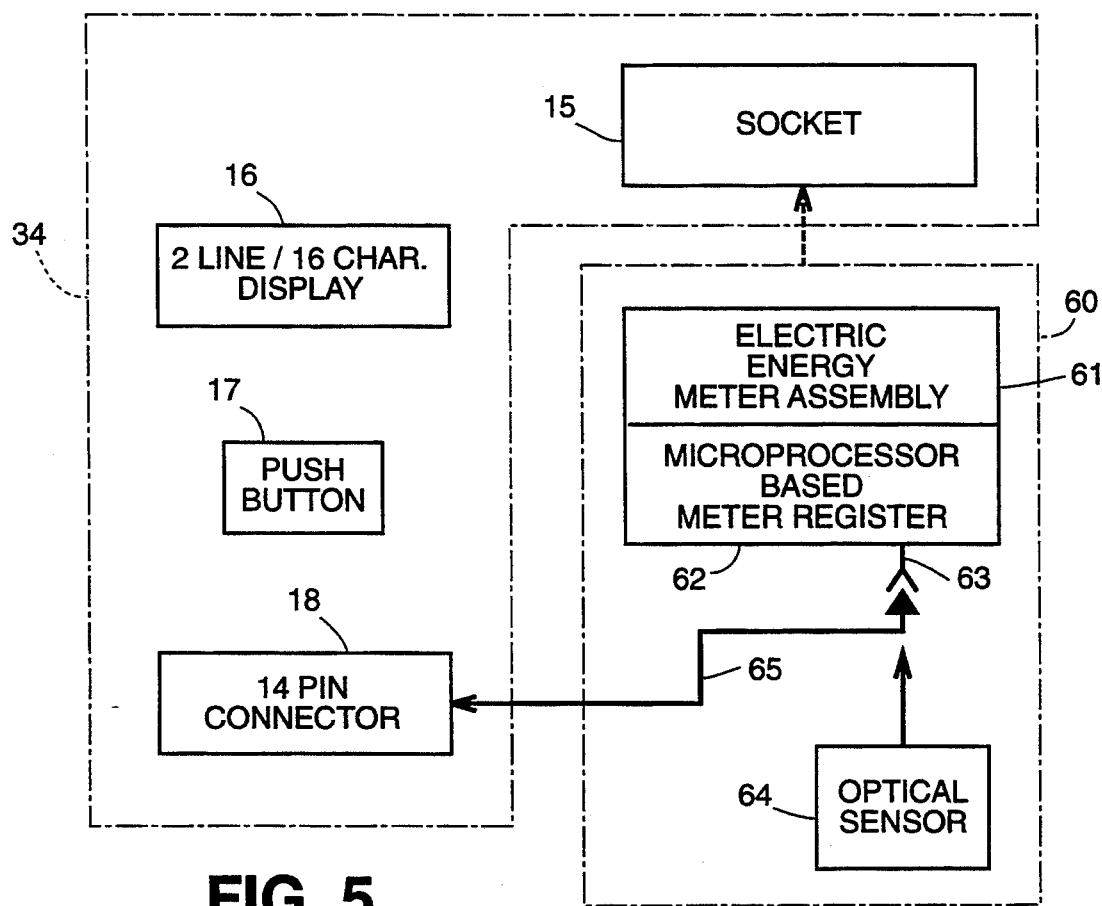
FIG. 5 is a block diagram, somewhat diagrammatic, illustrating details of the front panel of the test bench of FIG. 1.

Before proceeding with a more detailed description of the test system, it will be helpful to refer to FIG. 5 which illustrates diagrammatically the underlying basis upon which the register testing is performed. The phantom outline box 60 represents a typical energy meter which is provided with a microprocessor-based meter register. Such meters have the usual electromechanical mechanism with voltage and current coils, eddy current disk, shutter disk, and mechanical dial register for indicating power consumption in kilowatts. This portion of the meter is represented by the labeled box 61. Mounted within the meter housing in association with the mechanical mechanism is the microprocessor-based meter register 62. The meter register 62 is provided with an input connector indicated symbolically at 63 to which is normally joined an optical sensor 64 located for cooperation with the shutter disk for detecting the rotation of the shutter disk and indirectly the rotation of the eddy current disk. In performing the tests contemplated by the present apparatus, a meter 60 is plugged into one of the sockets 15 that has been configured by the socket switching circuit 55 to supply power to the particular meter model. The optical sensor 64 is disconnected from the connector 63 and in its stead is connected a jumper cable represented by the line 65 between the connector 63 and the 14 pin connector 18 in the section 34 of the test bench 10.

Figure 4:
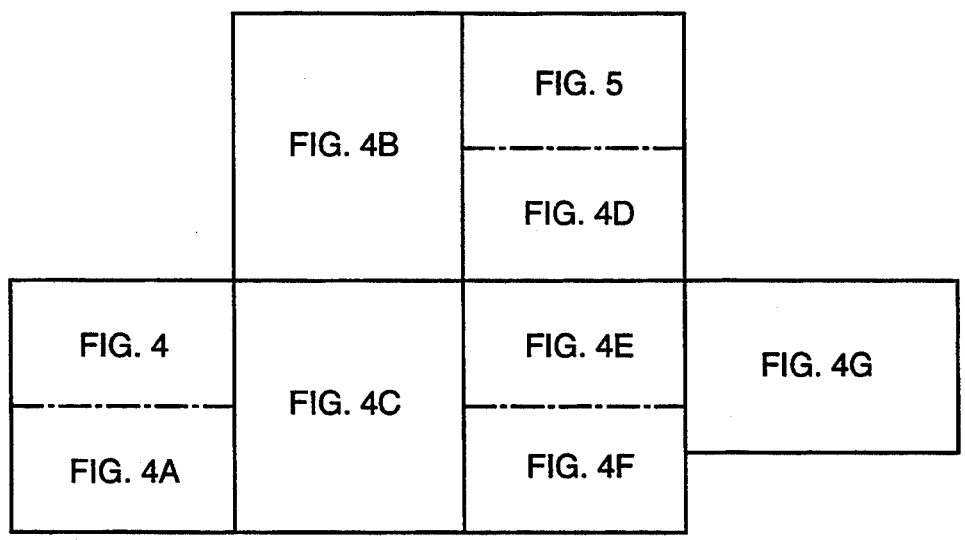
FIG. 4 is a figure orientation diagram showing the inter-relationship of FIGS. 4A to 4G and FIG. 5.
Figure 4A:
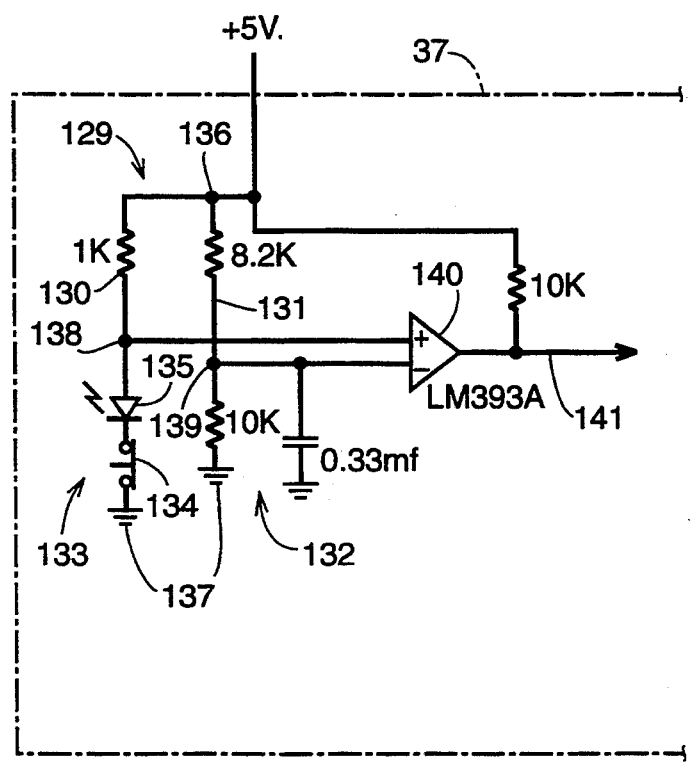
FIG. 4A is an electrical schematic diagram of the circuit components that produce the master reset signal for the reset and interrupt control circuit of FIG. 3.
Figure 4B:
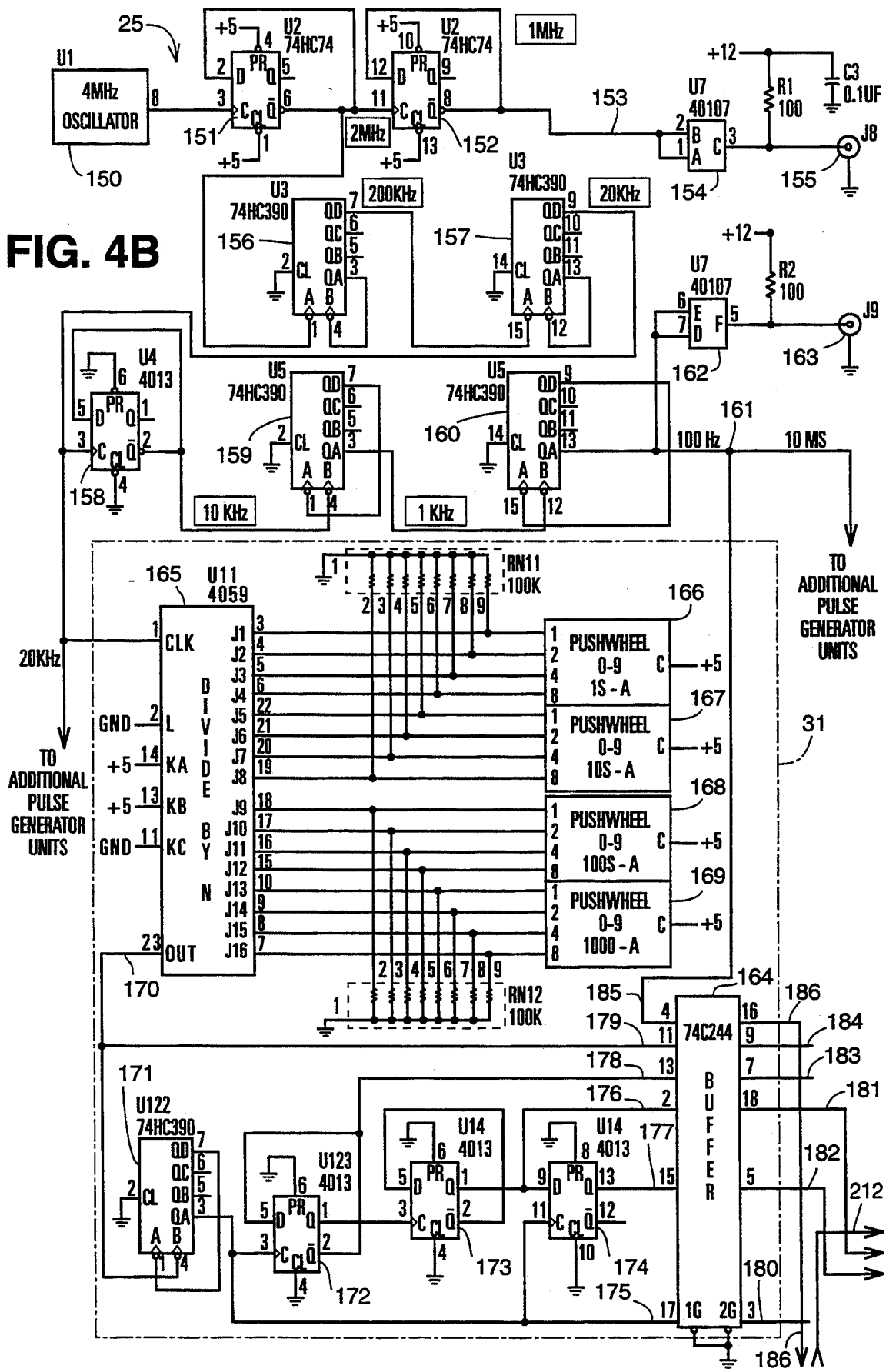
FIG. 4B is a schematic diagram of the pulse generator system time base and pulse generator of FIG. 3.
Figure 4C:
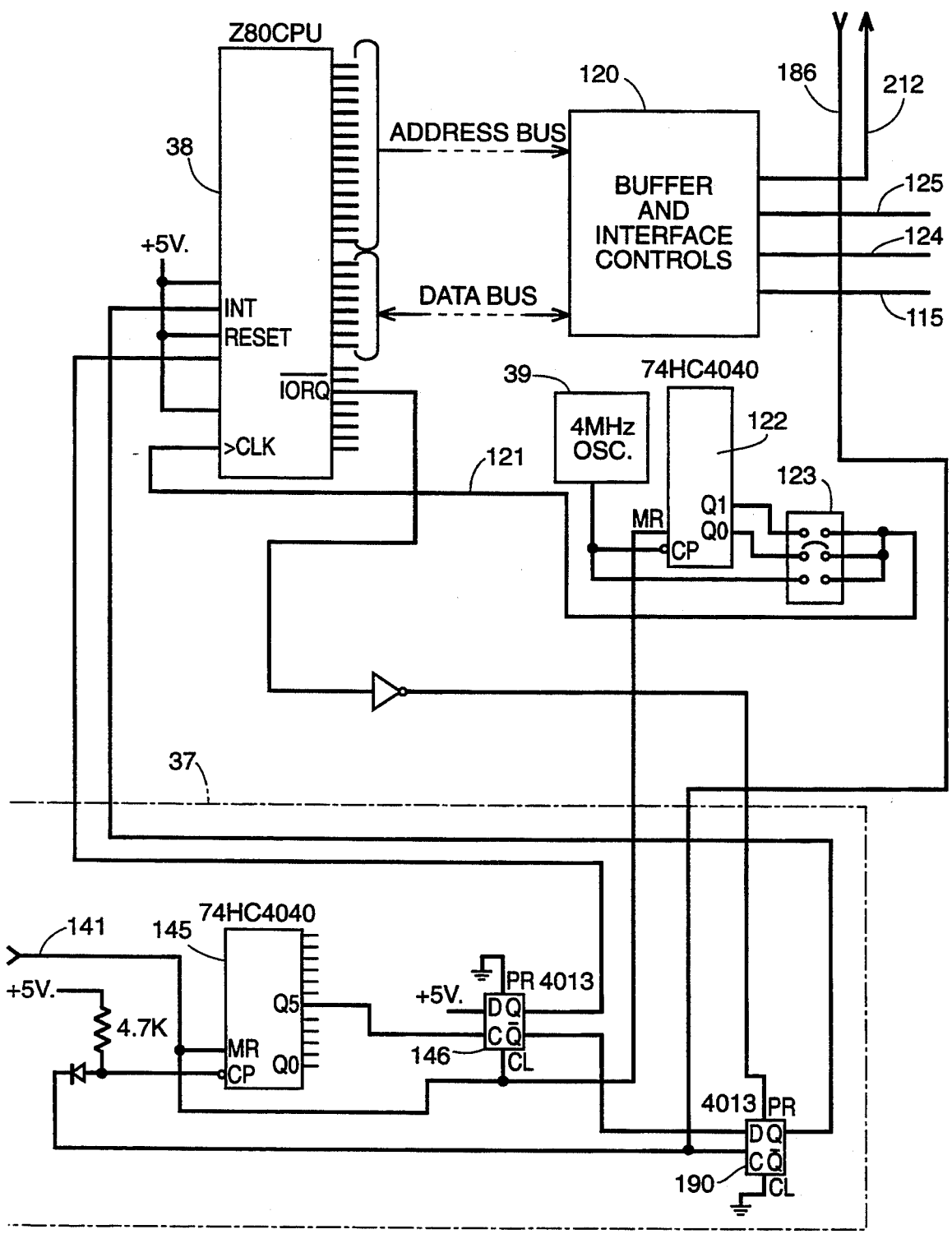
FIG. 4C is a schematic diagram of the central processing unit of FIG. 3 and certain of its associated components including the reset and interrupt control.
Figure 4D:
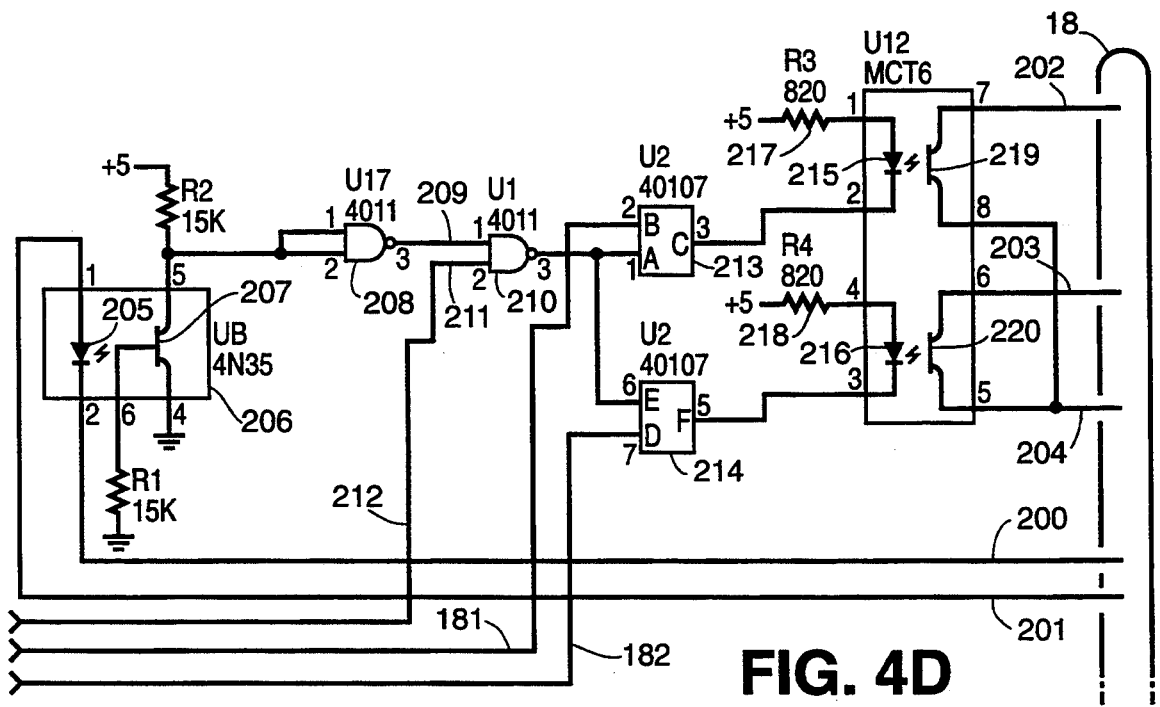
FIG. 4D is a schematic diagram showing details of the meter interface of FIG. 3.
Figure 4E:
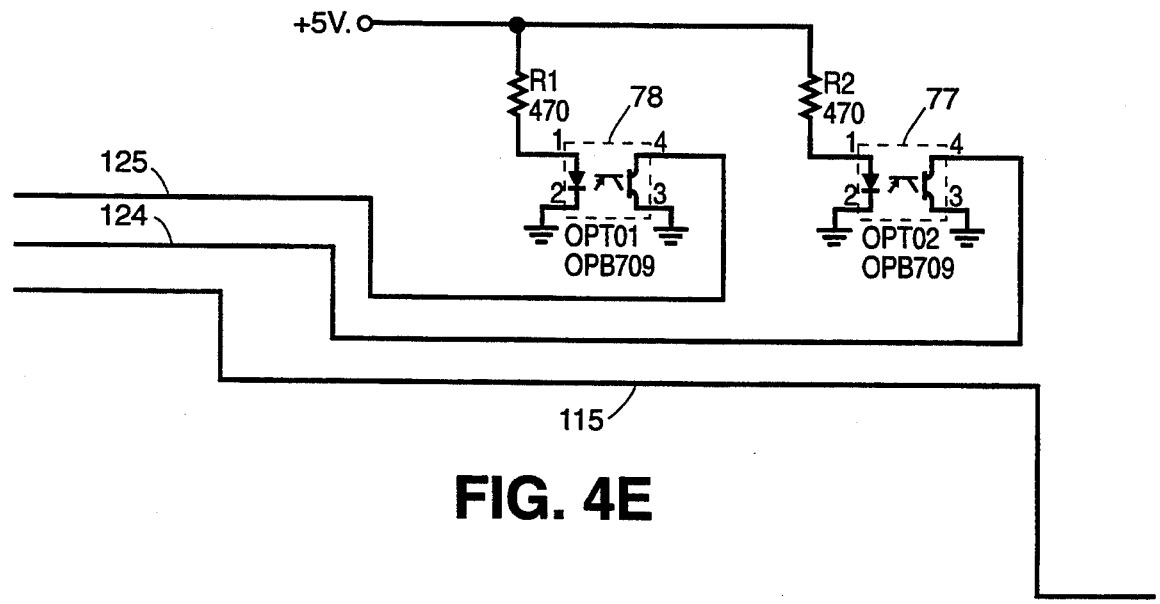
FIG. 4E is a schematic diagram of the meter and arm sensing elements of FIG. 3.
Figure 4F:
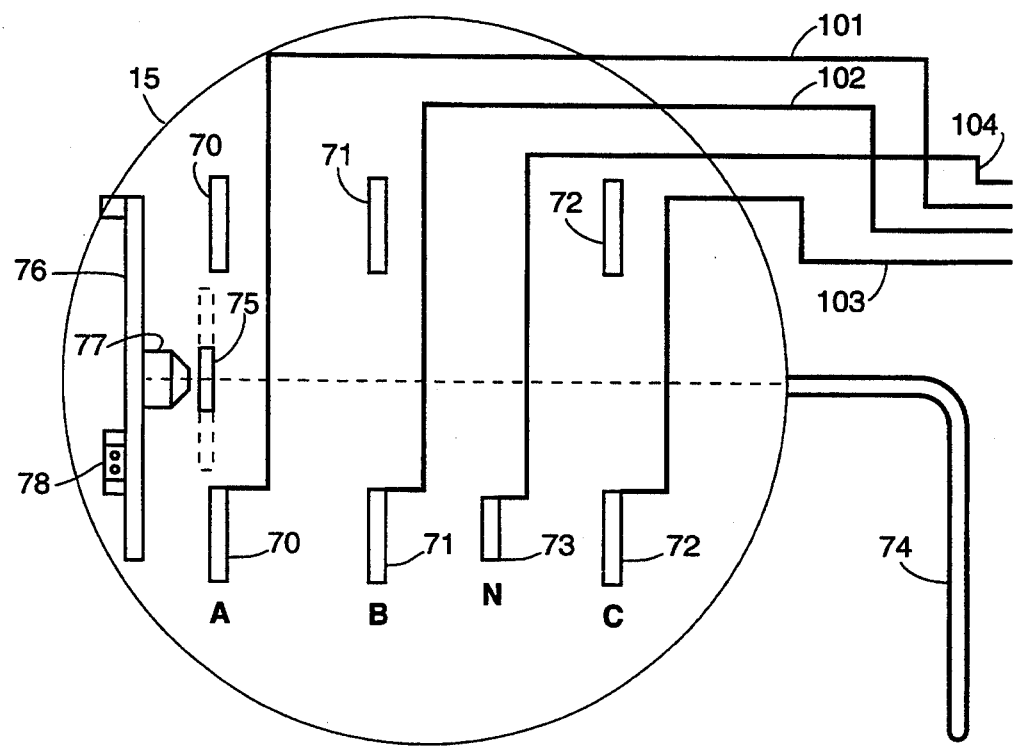
FIG. 4F is an enlarged diagrammatic view of the meter socket of FIG. 3 showing details of the meter and arm sensing units.

Referring to FIG. 4F there is shown the essential details of the socket 15 employed in the present invention. The socket used is a Landis & Gyr. HQ BLOCK otherwise known as a "zero insertion force" meter socket having three pairs of contacts or stabs designated respectively, 70, 71 and 72, and a neutral contact or stab 73. The stabs are otherwise designated as "A", "B", "C" and "N". An external locking lever 74 communicates with an internal arm 75 and other elements not shown which in one position, where the arm 75 occupies the position shown in broken lines, opens the various stabs within the socket permitting the insertion of the contacts on the meter with essentially zero force. Manually holding the meter in place, the locking lever 74 is rotated into a second position wherein the stabs are released and the meter is secured in place. The arm 75 is now in the position shown in solid lines. The socket described so far is of known construction and need not be discussed in further detail.

Mounted alongside the conventional structure of socket 15 is a substrate 76 carrying two reflective photodetector devices 77 and 78. The detector 77 is positioned to detect the presence of arm 75 of the locking lever 74 in the locking position shown in solid lines in FIG. 4F. When the arm 75 moves to the position shown in dotted lines, the meter is unlocked and can be removed. At the same time, the arm 75 is no longer within the "sight" of the detector 77. The discussion below will explain the effect this action has on the operation of the system.

The other detector, 78, is oriented with its sight directed normal to the face of the socket and located so as to respond to the presence or absence of a meter in the socket. While viewing the sheet containing FIG. 4F, it will be convenient to refer also to FIG. 4E where the reflective photodetectors 77 and 78 are shown in an actual circuit environment connected between ground and a low voltage +5 V. supply. The detectors 77 and 78 are each implemented by a type OPB709 unit.

Where, throughout the description and drawings, reference is had to a +5 V. supply, it should be understood as referring to an output of the low voltage supply 26 or to a similar auxiliary circuit, not shown, providing such voltage from energy received from the 12 V. DC supply 21.

Figure 4G:
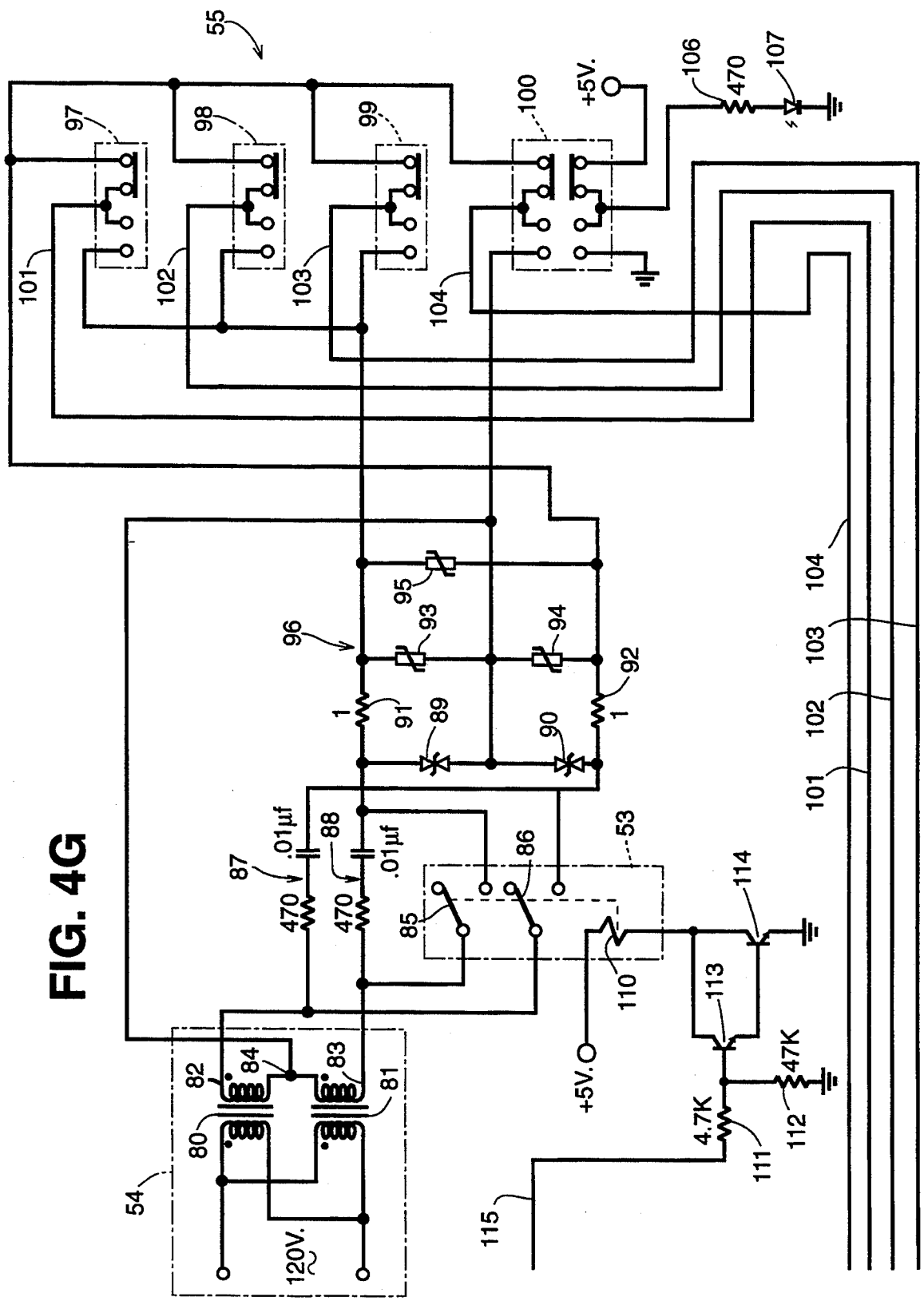
FIG. 4G is a schematic diagram of the power relay and socket switching elements of FIG. 3.

Now, reference should be had to the series of FIGS., 4A through 4G, assembled as shown in FIG. 4. It may be helpful to note that FIG. 4A when viewed with FIG. 4C shows within the phantom box 37 the details of the similarly numbered box in FIG. 3. The remainder of FIG. 4C shows details of the unit 30 in FIG. 3. The upper half of FIG. 4B shows the pulse generator system time base 25 of FIG. 3, while the lower portion of FIG. 4B, shows within the phantom outline 31 the pulse generator 35 of FIG. 3. FIG. 4D shows the meter interface 36 of FIG. 3, while FIG. 4G shows the 120/240 V. AC supply 54, relay 53 and socket switching component 55 of FIG. 3. The detailed schematics of FIGS. 4A to 4G do not show the switch 20 and low voltage supply 21 which are shown in FIGS. 2 and 3. However, the 120/240 V. AC supply 54, shown in FIG. 3, is represented in FIG. 4G by the two transformers 80 and 81 whose secondary windings are interconnected and poled to provide 240 volts AC across the two windings in, series, and 120 volts of opposing phase between end terminals 82 and 83 and the centertap 84. The 120 V. AC applied to the primary windings of transformers 80 and 81 is obtained from the output of switch 20 in FIGS. 2 and 3. Thus, whenever switch 20 is in closed position the transformers 80 and 81 will be supplied with power.

The secondary windings of transformers 80 and 81 are connected through relay contacts 85 and 86 of relay 53. Connected across relay contacts 85 and 86 are respective RC snubber networks, 87 and 88, to prevent arcing and eliminate some of the noise associated with breaking power to a meter potential coil inductive load. A network of bipolar zener diodes 89 and 90, resistors 91 and 92, and metal oxide varistors 93, 94 and 95 forms a filter circuit 96 to further reduce the noise associated with switching of the metering device under test. The zener diodes 89 and 90 are of type 1.5KE130 while the varistors 93, 94 and 95 are of type V130LA20A.

The output from filter network 96 is connected through a series of four 3-position switches 97, 98, 99, and 100, the positions of which determine the voltage and phase supplied to the lines 101, 102, 103 and 104 that connect, respectively, with the stabs 70, 71, 72 and 73 in the meter socket 15 (FIG. 4F). The switch 100 determines whether the voltage applied to the meter socket stabs is 120 volts to neutral or 240 volts to neutral. If the latter, switch 100 will be in the position shown in FIG. 4G whereby +5 volts is connected to resistor 106 in series with LED 107 to ground, providing a visible signal that the switches are configured for the higher voltage.

Relay 53 has a winding 110 connected through a control circuit consisting of resistors 111 and 112 and two type 2N4401 transistors 113 and 114 connected between the +5 V. low voltage supply and ground as shown. Control for the relay 53 is supplied over connection 115 to resistor 111 from the buffer and interface controls 120 under the control of the microprocessor 38 (FIG. 4C). The Zilog Z80 microprocessor 38 provides the logic and control functions for this segment of the system. The processor runs a program held in the ROM 42 (FIG. 3).

The microprocessor 38 is clocked by a signal over connection 121 obtained from the 4 MHz crystal oscillator 39. A divider 122 provides signals at 1 and 2 MHz, in addition to the 4 MHz oscillator output, which are coupled through a selectable jumper switch 123 enabling clocking speed to be selected.

From FIGS. 4C and 4E it can be seen that the arm and meter sensing reflective photodetectors 77 and 78 are linked over connections 124 and 125 with the buffer and interface controls 120.

Attention should now be directed to FIGS. 4A and 4C containing the reset and interrupt control 37. The portion of the control 37 appearing in FIG. 4A may be considered as a master reset signal generating means comprising a four terminal bridge network 129 having two arms, 130 and 131, containing resistors, a third arm, 132, containing an RC time constant circuit, and a fourth arm, 133 containing a normally closed manually operable switch 134 in series with an LED device 135. The LED device 135 requires a voltage of approximately 3 volts or slightly less to initiate conduction. At lower voltage levels it presents substantially an open-circuit impedance until conduction occurs. Once conduction occurs, the voltage drop thereacross is maintained substantially constant.

As seen in FIG. 4A, one set of diagonal terminals 136 and 137 of the bridge network 129 is connected between the +5 V. low voltage source and ground. It should be understood that this low voltage is present only while the low voltage supply 26 (FIG. 3) is energized due to closure of switch 20 and energization of the supply 21.

The opposite set of diagonal terminals 138 and 139 of the bridge network 129 is connected, respectively, to the (+) and (−) input terminals of a comparator circuit 140. When switch 20 is initially closed energizing the 12 V. DC supply 21, and thereupon the supply 26, the voltage from supply 26 will take a finite time to rise to +5 V. This voltage is applied to terminal 136, and the RC circuit in arm 132 imposes a delay on the application of such voltage to the (−) input terminal of comparator 140. The LED device 135 provides the effect of a non-linear resistance causing the potential applied to the (+) input terminal of the comparator 140, to rise with rise of the voltage from supply 26 up to the conduction level of the LED. Whereupon the (+) input voltage is held constant. At Some moment in time the potential at point 139 will exceed the clamped voltage at point 138 and the comparator 140 will alter its state. Consequently, the comparator 140 provides a "high" output at 141 initially which is maintained for about one millisecond until the potential at terminal 139 exceeds that at terminal 138. This "high" output at 141 serves as a master reset signal for the two dividers 145 and 122, and the D-flip flop 146 in FIG. 4C.

Application of the master reset signal on connection 141 to the flip flop 146 insures that the "Q" output is in a "low" state. This provides the reset state for the microprocessor 38. The divider or counting chain 145 is also reset at this time insuring that all of its outputs are in the "low" state. When the signal on 141 returns to a "low" state, the resets are removed from the divider 145 and flip flop 146 thereby enabling these devices.

Attention now has to be directed to the pulse generator circuits shown in FIG. 4B. A 4 MHz crystal oscillator 150 feeds the clock input of a D-flip flop 151 connected for dividing by two to produce a 2 MHz pulse signal which is applied over one path to the clock input of another D-flip flop, 152, producing a 1 MHz pulse at 153 that is applied through a buffer stage 154 to a test point or terminal 155. Checking the pulse rate at terminal 155 provides means for verifying the accuracy of the higher pulse rate signals from which it is derived.

The 2 MHz pulse signal is applied over another path to a decade divider 156 producing a 200 KHz pulse signal that is divided further by divider 157 to produce a 20 KHz pulse signal. The 20 KHz signal is supplied over a first path to the clock input of a flip flop divider 158 whose 10 KHz output feeds decade divider 159 which, in turn, feeds decade divider 160 producing a 100 Hz or 10 ms period square wave signal at 161.

For calibration purposes the 10 ms signal is fed through a buffer stage 162 to another test point or terminal, 163. In addition, the 10 ms signal at 161 is fed to an input of a buffer stage 164 in each of the four pulse generator units served by the foregoing pulse generator system time base 25.

As shown in FIG. 4B, the 20 KHz signal is supplied to the clock inputs of a variable divider stage 165 in each of the six pulse generators 31, associated with the above time base 25. The divider 165 is programmable through the use of a series of push wheel switches 166, 167, 168 and 169 to provide division ratios between 3 and 9999. The division ratio of the divider 165 sets the pulse rate of tee signals sent to the register under test.

The output at 170 from the divider 165 is applied to a series of dividers 171, 172 and 173 and to a phase shifting flip flop 174, for producing at the inputs of buffer 164 a series of related pulse signals. These signals are a signal of frequency "A" at input 176; a signal of frequency "A", shifted 90° from signal "A", at input 177; a signal at twice the frequency of "A" at input 178; a signal at forty times the frequency of "A" at input 179; and a signal at four times the frequency of "A" at input 175. Corresponding signals appear at outputs 180, 181, 182, 183 and 184 of the buffer 164. The 10 ms signal from 161 is applied to the input 185 of buffer 164 to appear on output path 186 which can be followed into FIG. 4C where it feeds the clock input of the D-flip flop 190, as well as the clocking input of divider 145.

To recapitulate to this point, it will be seen that the reset signal generating means comprises the pulse counting circuit 145 (FIG. 4C) to which the master reset signal from 141 (FIG. 4A) is coupled for resetting the circuit 145 whenever power is initially applied. The buffer 164 in the pulse generator 31 (FIG. 4B) supplies 10 ms pulses to the clock input of the circuit 145 over path 186. The flip flop 146 (FIG. 4C) constitutes means responsive to the appearance of the master reset signal at 141 for applying an extended reset signal to the microprocessor 38. The Q5 ($2^5$) output from the pulse counter 145 provides a signal to flip flop 146 after receipt by counter 145 of 32 pulses, i.e., after about 320 ms subsequent to initial reset. The signal from Q5 causes flip flop 146 to reverse state rendering "Q" high and "$\overline{Q}$" low. The high "Q" state enables the microprocessor 38, while the low "$\overline{Q}$" state enables the D-flip flop 190 (FIG. 4C) which now responds alternately to a clock pulse from the buffer 164 over path 186, and a preset pulse from the $\overline{IORQ}$ output of the microprocessor 38. The "Q" output of circuit 190 provides the INTERRUPT (INT) signal for the microprocessor 38.

All processor input and output is accomplished under interrupt control every 10 ms. This insures that external events are responded to inca timely manner regardless of what the processor is doing. The interrupt routine also keeps time for the system, providing accurately timed state changes for register testing purposes. The flip flop 190 provides the interrupt control. As long as the processor is not reset, the "D" input to device 190 will remain low. This allows an interrupt to be generated and supplied to the processor at the positive transition of the 10 ms timing signal. Since the processor only performs I/O functions from an interrupt service routine, the $\overline{IORQ}$ (input/output request) signal from the processor is used to remove the interrupt by resetting flip flop 190.

Referring now to FIGS. 4B, 4C and 4D, the construction and operation of the meter interface 36, mentioned previously with reference to FIG. 3, can be considered. As seen in FIG. 4D, the interface to the meter is accomplished through five connections, 200, 201, 202, 203 and 204 in front panel connector 18. Since each of the four stations in a column 13 must be totally independent, all connections are optically isolated. The connections 200 and 201 bring an LED STROBE signal from the register under test into the meter interface. The register uses this strobe signal to activate a shutter disk rotation sensing LED only during times when actual sensing is performed. This increases LED life without affecting function. The strobe signal is applied in the meter interface to the LED 205 in a type 4N35 device 206 which cooperates with a phototransistor 207. The LED 205 simulates the actual load presented to the register strobe driver under normal operating conditions. The phototransistor 207 responds to the strobe signals and supplies a corresponding signal through an inverting NAND gate buffer 208 to one input 209 of NAND gate 210. An ENABLE signal is applied to the second input, 211, of NAND gate 210 over path 212 which can be traced back through FIG. 4B into FIG. 4C and to an output of the buffer and interface controls 120. When both signals are present at inputs 209 and 211, an ENABLE signal is applied to one input of each of two high drive capability, open collector NAND gates, 213 and 214. A second input of each of the gates 213 and 214 is connected, respectively, to paths 181 and 182 coming from the buffer 164 in FIG. 4B. When both inputs of gate 213 or 214 are high, the output transistor in the particular gate (not shown) is rendered conductive causing current to flow through the corresponding LED, 215 or 216, and its associated resistor 217 or 218 from the +5 V. supply. The LED's 215 and 216 are each associated with a respective phototransistor 219 and 220 in a type MCT6 device. The photo transistors 219 and 220 simulate the photodetectors used in the disk rotation sensor of the register and provide the pulse signals to the registers.

The operation of the test apparatus should now be apparent. A feature of the present arrangement is that if for any reason it becomes necessary to interrupt a test, manipulating the locking lever 74 of the socket 15 to the unlocked position will immediately shut down the system powering that socket. This operation is brought about through a signal from the arm sensing reflective photodetector 77 acting through the buffer and interface controls 120 causing the processor 38 to produce a signal on path 115 that deenergizes relay 53 opening the circuits to the socket.

Since the system is designed to test a variety of registers some provision is required for identifying the register which the system is configured to test. Referring to FIG. 3, an interface ID unit 51 is provided in association with the interface control 52 and meter interface 36. Each meter type is assigned a binary code number which is entered into the interface ID 51 by suitable switches or the like, not shown. The microprocessor 38 reads the code number entered in ID 51 during initialization and sets all operating parameters necessary to test the particular register.

Having described the invention with reference to the presently preferred embodiment thereof, it should be understood that various changes in construction can be introduced without departing from the true spirit of the invention as defined in the appended claims.

I claim:

1. Apparatus for testing a microprocessor-based register in an electric energy meter comprising in combination a power supply circuit, means controlled by a switch for selectively coupling said power supply circuit to a source of electric energy, a testing microprocessor, a pulse generator coupled to said testing microprocessor, a plural contact meter socket, means coupled to said testing microprocessor and to said socket for detecting the presence or absence of a meter inserted in said socket, means for coupling an input/output port of said register to said testing microprocessor, means coupled with said testing microprocessor and to said power supply circuit for supplying electric energy to said meter socket when a meter is present for energizing said register in said meter, and means for controlling said testing microprocessor for enabling pulses to be fed from said pulse generator to said register in a predetermined manner for testing the operation of said register.

2. Apparatus according to claim 1, wherein said meter socket comprises a zero insertion force universal meter socket having a locking lever which in a first position frees said socket for insertion of a meter into or removal of a meter from said socket, and in a second position locks an inserted meter against removal from said socket, and said apparatus further comprises means coupled to said socket for detecting the position of said locking lever, and means responsive to said locking lever position detecting means for preventing said electric energy supplying means from supplying energy to said socket when said locking lever is not in said second position.

3. Apparatus according to claim 2, further comprising display means coupled responsively to said testing microprocessor for providing communication with a human operator.

4. Apparatus according to claim 3, wherein said electric energy supplying means comprises means interconnecting said power supply circuit with said meter socket for establishing for a given electric energy meter the corresponding energization of said plural contacts in the configuration required for said given meter.

5. Apparatus according to claim 4, wherein said means for controlling said testing microprocessor comprises means for enabling said testing microprocessor to supply said display means with signals that enable said display means to display information identifying the register model for which said testing microprocessor is prepared to test.

6. Apparatus according to claim 1, further comprising display means coupled responsively to said testing microprocessor for providing communication with a human operator.

7. Apparatus according to claim 6, wherein said electric energy supplying means comprises means interconnecting said power supply circuit with said meter socket for establishing for a given electric energy meter the corresponding energization of said plural contacts in the configuration required for said given meter.

8. Apparatus according to claim 7, wherein said means for controlling said testing microprocessor comprises means for enabling said testing microprocessor to supply said display means with signals that enable said display means to display information identifying the register model for which said testing microprocessor is prepared to test.

9. Apparatus according to claim 1, wherein said electric energy supplying means comprises means interconnecting said power supply circuit with said meter socket for establishing for a given electric energy meter the corresponding energization of said plural contacts in the configuration required for said given meter.

10. Apparatus according to claim 9, wherein said meter socket comprises a zero insertion force universal meter socket having a locking lever which in a first position frees said socket for insertion of a meter into or removal of a meter from said socket, and in a second position locks an inserted meter against removal from said socket, and said apparatus further comprises means coupled to said socket for detecting the position of said locking lever, and means responsive to said locking lever position detecting means for preventing said electric energy supplying means from supplying energy to said socket when said locking lever is not in said second position.

11. Apparatus according to claim 1, wherein said testing microprocessor includes a plurality of resettable components and a reset and interrupt control circuit, said reset and interrupt control circuit comprising reset signal generating means and means for generating a master reset signal commencing with the connection of said power supply circuit to said source of electric energy and terminating a controlled interval after commencing.

12. Apparatus according to claim 11, wherein said master reset signal generating means comprises a four terminal bridge network, one set of diagonal terminals of said bridge network being connected between points supplied with operating voltage while said power supply circuit is energized, the opposite set of diagonal terminals of said bridge network being connected to the input terminals of a comparator circuit, one leg of said bridge network including a time constant circuit arranged to impose a delay on the application of a predetermined fraction of said operating voltage to one of said comparator input terminals, another leg of said bridge network including non-linear resistance means for imposing upon the other of said comparator terminals a potential that, at the instant when said operating voltage is first supplied, substantially equals said operating voltage for a finite interval as said operating voltage rises from zero to a predetermined value whereupon said potential is maintained at a level below said predetermined fraction of said operating voltage, thereby enabling said comparator circuit to provide at an output a master reset signal during the time interval the potential at said other of said comparator input terminals exceeds the fraction of said operating voltage at said one of said comparator input terminals.

13. Apparatus according to claim 12, wherein said reset signal generating means comprises a pulse counting circuit, means coupling said master reset signal to said counting circuit for resetting said counting circuit whenever power is applied to said counting circuit, means for applying pulses of finite duration from said pulse generator to a clock input of said counting circuit, means responsive to the appearance of said master reset signal for applying an extended reset signal to said testing microprocessor, and means coupling an output of said pulse counting circuit to said means for applying an extended reset signal to terminate said extended reset signal upon said counting circuit responding to a predetermined number of pulses.

14. Apparatus for resetting a testing microprocessor system wherein said testing microprocessor includes a plurality of resettable components and a reset and interrupt control circuit, said reset and interrupt control circuit comprising reset signal generating means and means for generating a master reset signal commencing with the connection of a power supply circuit to a source of electric energy and terminating a controlled interval after commencing, said master reset signal generating means comprising a four terminal bridge network, one set of diagonal terminals of said bridge network being connected between points supplied with operating voltage while said power supply circuit is energized, the opposite set of diagonal terminals of said bridge network being connected to the input terminals of a comparator circuit, one leg of said bridge network including a time constant circuit arranged to impose a delay on the application of a predetermined fraction of said operating potential to one of said comparator input terminals, another leg of said bridge network including non-linear resistance means for imposing upon the other of said comparator terminals a potential that, at the instant when said operating voltage is first supplied, substantially equals said operating voltage for a finite interval as said operating voltage rises from zero to a predetermined value whereupon said potential that is imposed on the other of said comparator terminals is maintained at a level below said predetermined fraction of said operating voltage such that said comparator circuit provides at an output a master reset signal during the time interval the potential at said other of said comparator input terminals exceeds the fraction of said operating voltage at said one of said comparator input terminals.

15. Apparatus according to claim 14, wherein said reset signal generating means comprises a pulse counting circuit, means coupling said master reset signal to said counting circuit for resetting said counting circuit whenever power is applied to said counting circuit, means for applying pulses of finite duration from a pulse generator to a clock input of said counting circuit, means responsive to the appearance of said master reset signal for applying an extended reset signal to said testing microprocessor, and means coupling an output of said pulse counting circuit to said means for applying an extended reset signal to terminate said extended reset signal upon said counting circuit responding to a predetermined number of pulses.

* * * * *

UNITED STATES PATENT AND TRADEMARK OFFICE
CERTIFICATE OF CORRECTION

PATENT NO. : 5,337,250
DATED : August 9, 1994
INVENTOR(S) : Joseph F. Sidiski

It is certified that error appears in the above-indentified patent and that said Letters Patent is hereby corrected as shown below:

Column 5, line 23, after "in" delete comma ",".

Column 7, line 22, "tee" should read --the--; line 53 "Q" should read --"$\bar{Q}$"--; line 54, "Q" should read --"$\bar{Q}$"--; line 62 "inca" should read --in a--.

Column 11, line 23, change "potential" to --voltage--.

Signed and Sealed this

Third Day of January, 1995

Attest:

BRUCE LEHMAN

Attesting Officer    Commissioner of Patents and Trademarks